(12) United States Patent
Chen

(10) Patent No.: US 8,581,290 B2
(45) Date of Patent: Nov. 12, 2013

(54) EMBEDDING TYPE SOLDER POINT-FREE COMBINATION STRUCTURE OF LED BEADS WITH SUBSTRATE OR LAMP BODY

(76) Inventor: Hon Wen Chen, Shinshih Village (TW)

( * ) Notice: Subject to any disclaimer, the term of this patent is extended or adjusted under 35 U.S.C. 154(b) by 591 days.

(21) Appl. No.: 12/457,401

(22) Filed: Jun. 10, 2009

(65) Prior Publication Data

US 2010/0171142 A1    Jul. 8, 2010

(30) Foreign Application Priority Data

Jan. 5, 2009 (TW) ................................ 98200034 U

(51) Int. Cl.
*H01L 33/00* (2010.01)
(52) U.S. Cl.
USPC .................................. 257/99; 257/93; 257/98
(58) Field of Classification Search
USPC .......................................... 257/79, 93, 98, 99
See application file for complete search history.

(56) References Cited

U.S. PATENT DOCUMENTS

2008/0094857 A1* 4/2008 Smith et al. .................... 362/649
2008/0315784 A1* 12/2008 Tseng ............................ 315/250

* cited by examiner

*Primary Examiner* — Ori Nadav
(74) *Attorney, Agent, or Firm* — Rosenberg, Klein & Lee

(57) ABSTRACT

This invention relates to an embedding type solder point-free combination structure of LED beads with substrate or lamp body, in which the LED chip is packaged on the embedded heat conductive socket to form embedding type LED beads without soldering for electric conduction, and the embedding type LED beads are fixed in the docking hole of the substrate or the lamp body by a detachable dock-fixing structure. Furthermore, the embedding type LED beads has elastic conductive pieces, while the substrate or lamp body has conductive contacts. The elastic conductive pieces of the embedding type LED beads and the conductive contacts provided on the substrate or lamp body are in close contact to form solder point-free structure when the embedding type LED beads are fixed in the docking hole of the substrate or lamp body by the dock-fixing structure. In this manner, it is convenient to mount or dismount the embedding type LED beads in case of maintenance needed.

5 Claims, 11 Drawing Sheets

EMBEDDING TYPE SOLDER POINT-FREE COMBINATION STRUCTURE OF LED BEADS WITH SUBSTRATE OR LAMP BODY

BACKGROUND OF THE INVENTION

1. Field of the Invention

This invention relates to an embedding type solder point-free combination structure of LED beads with substrate or lamp body, especially to an embedding type solder point-free combination structure of LED beads with substrate or lamp body in which a dock-fixing structure is provided between the embedding type LED beads and the substrate or lamp body so as to achieve good effectiveness of easy-mount and dismount, no solder point, and good heat dissipation.

2. Brief Description of Prior Art

The application of LED is becoming more and more diversified in view of its merits in long lifespan, low power consumption and high brightness. With respect to the application in a road lamp, a plenty of LEDs is required and the road lamp is usually install at high elevation so that it is not easy to replace the bad LED beads provided on the circuit board. Usually, the whole road lamp needs to be dismantled for repair. Not only the maintenance cost is high but also the maintenance is very inconvenient.

Currently, there are substantially two methods of mounting the LED on the circuit board. Descriptions will be made for these two methods as below.

<Method 1>

Two pins (111) of the LED (11) packaged in the type as shown in FIG. 10 is inserted in the circuit board (12) and then soldering is conducted for fixing the LED. This method consumes a lot of labor-hour, and the LED (11) cannot be applied in lighting industry due to its low lighting power.

<Method 2>

The circular or square shape LED beads (2) packaged in the type as shown in FIG. 11 is fixed on the circuit board (22) by means of screws or thermal grease (21), and the conductive wires (24) of the LED beads (2) is connected to the positive and negative contacts (25) on the circuit board (22) by spot soldering of tin solder (23). However, when the LED beads (2) are used in illumination lamp, usually the lamp uses big quantity of LED beads (2). Similarly, this method also consumes a lot of labor-hour in spot soldering. Especially, when several LED beads (2) on the illumination lamp are out of order and are to be replaced, the LED beads (2) should be removed one by one by spot soldering, either a huge amount of labor-hour is required for this maintenance or the whole circuit board (22) is replaced by a new one. Nevertheless, this will cause surging of maintenance cost.

SUMMARY OF THE INVENTION

The main object of this invention is to provide an embedding type solder point-free combination structure of LED beads with substrate or lamp body, in which the LED beads are fixed on substrate or lamp body without using conventional soldering method and are connected with the circuit wirings on substrate or lamp body, so as to achieve the effectiveness of mounting and dismounting the embedding type LED beads easily for replacement.

Another object of this invention is to provide an embedding type solder point-free combination structure of LED beads with substrate or lamp body, in which heat transfer between the embedding type LED beads and the substrate or the lamp body is conducted by close contact there between, rather than by a thermal grease disposed there between, so as to transfer the heat generated by the embedding type LED beads effectively to the external heat sink.

This invention provides an embedding type solder point-free combination structure of LED beads with substrate or lamp body, in which the LED chip is packaged on the embedded heat conductive socket to form embedding type LED beads without soldering for electric conduction, and the embedding type LED beads fixed in the docking hole of the substrate or the lamp body by a detachable dock-fixing structure. Further, the embedding type LED beads has elastic conductive pieces, while the substrate or lamp body has conductive contacts. The elastic conductive pieces of the embedding type LED beads and the conductive contacts provided on the substrate or lamp body are in close contact to form solder point-free structure when the embedding type LED beads are fixed in the docking hole of the substrate or lamp body by the dock-fixing structure. In this manner, it is convenient to mount or dismount the embedding type LED beads in case of maintenance needed.

In the abovementioned detachable dock-fixing structure, an inclined guide-stripe is provided on the outer periphery of the embedding type LED beads and a pressing-stripe is provided on the substrate or the lamp body. When the embedding type LED beads are rotated to be inserted into the substrate or the lamp body, the inclined guide-stripe of the embedding type LED beads is pressed by the pressing-stripe on the substrate or the lamp body such that the embedding type LED beads can be inserted and fixed in the substrate or the lamp body.

The above embedding type LED beads further provides, on the bottom of the heat conductive socket, a heat conductive layer which preferably has deformable or elastic capability. Therefore, the heat generated by the embedding type LED beads is ensured to be transferred to the substrate or the lamp body for heat dissipation by means of the combination and fixing between the embedding type LED beads and the substrate or the lamp body.

The above embedding type LED beads further comprises a fastening member provided at the outside of the heat conductive socket. The abovementioned detachable dock-fixing structure is provided between the fastening member and the docking hole.

In the abovementioned detachable dock-fixing structure, the outer periphery of the fastening member and the docking hole has mating threading segments respectively for threaded locking with each other.

The above embedding type LED beads further comprises an insulation socket provided between the heat conductive socket and the fastening member. The insulation socket has positioning portions extending outward and then upward. The abovementioned elastic pieces are embedded in the positioning portions, and then connected with the pins of the LED chip. A gap is formed between the positioning portions of the insulation socket and the frame body itself for the accommodation of the fastening member.

In the abovementioned detachable docking fixing structure, the fastening member is provided with an engaging portion which is caught and fixed in a corresponding arresting hole provided on the substrate of the lamp body.

BRIEF DESCRIPTION OF THE ACCOMPANYING DRAWINGS

DETAILED DESCRIPTION OF THE PREFERRED EMBODIMENTS

Figure 1:
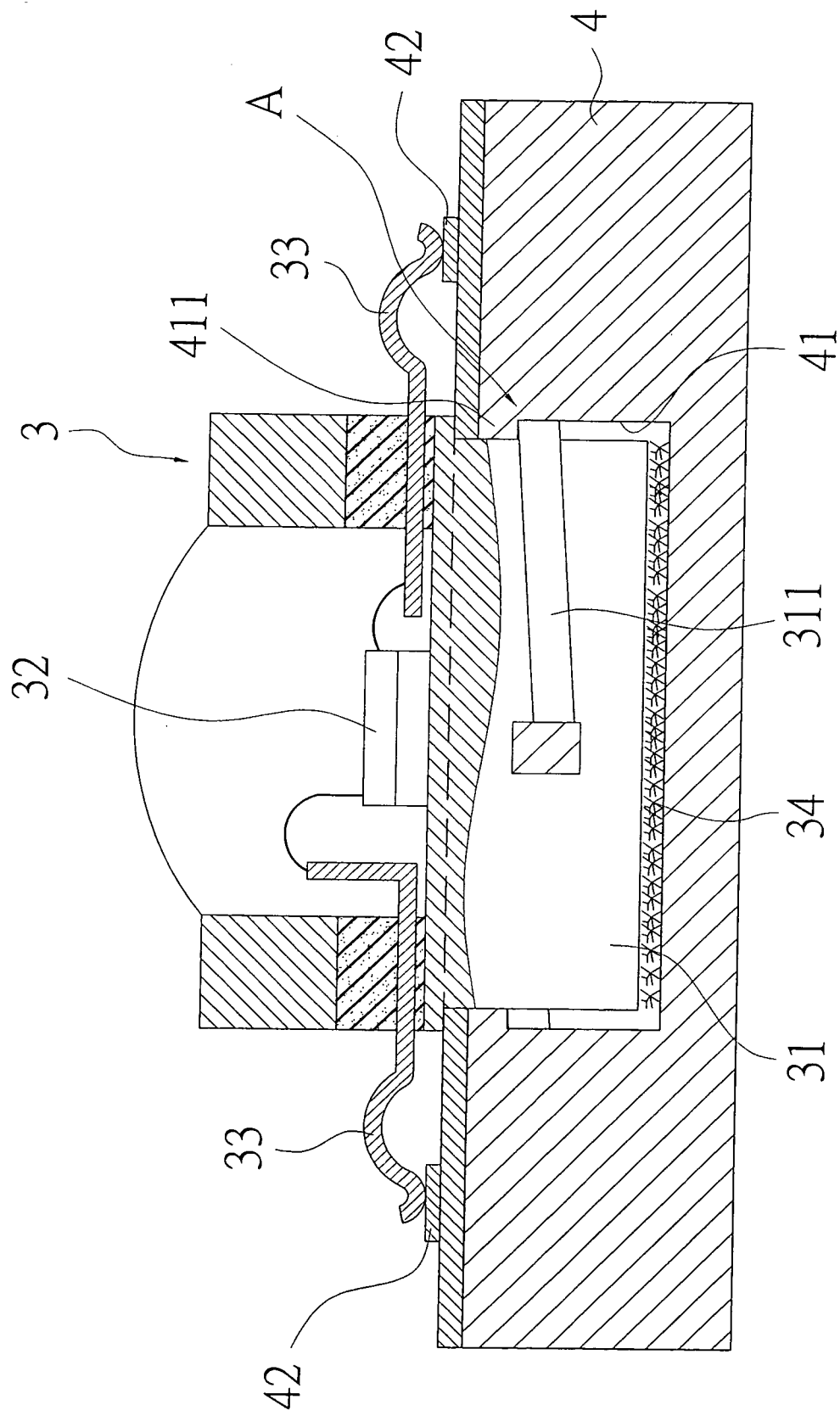
FIG. 1 is a schematic sectional side view showing the assembly of the first embodiment of the embedding type LED beads and the substrate or the lamp body of the present invention.

FIG. 1 is a schematic view showing the structure of the first embodiment of the embedding type LED beads (3) and the substrate or the lamp body. As shown in the figure, the embedding type LED beads (3) has a heat conductive socket (31), and at least one LED chip (32) is packaged on the top face of the heat conductive socket (31) which, in this manner, is formed to be an insertion socket without soldering for electric conduction. At least one docking hole (41) for the accommodation of the heat conductive socket (31) is provided on the substrate or the lamp body (4). The heat conductive socket (31) is then fixed in the docking hole (41) by a dock-fixing structure (A). Furthermore, the embedding type LED beads (3) has elastic conductive pieces (33), while the substrate or the lamp body (4) has conductive contacts (42). When the embedded type LED beads (3) are inserted and fixed in the docking hole (41) of the substrate or the lamp body (4) by the docking fixing structure (A), the elastic conductive pieces (33) of the embedding type LED beads (3) and the conductive contacts (42) of the substrate or the lamp body (4) will be in firm contact with each other to form a contact structure without solder point.

Figure 2:
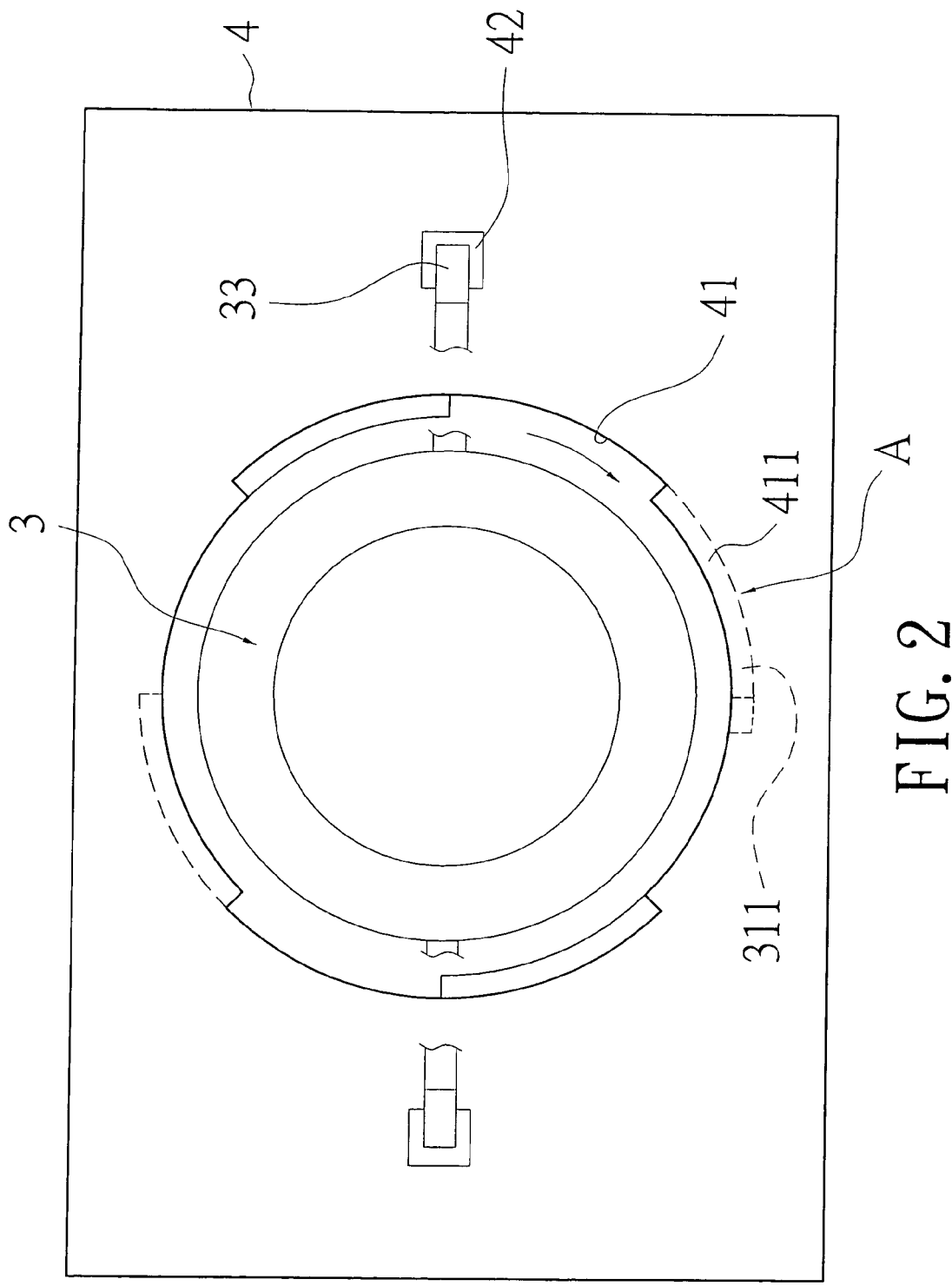
FIG. 2 is a schematic top view showing the assembly of the first embodiment of the embedding type LED beads and the substrate or the lamp body of the present invention.
Figure 3:
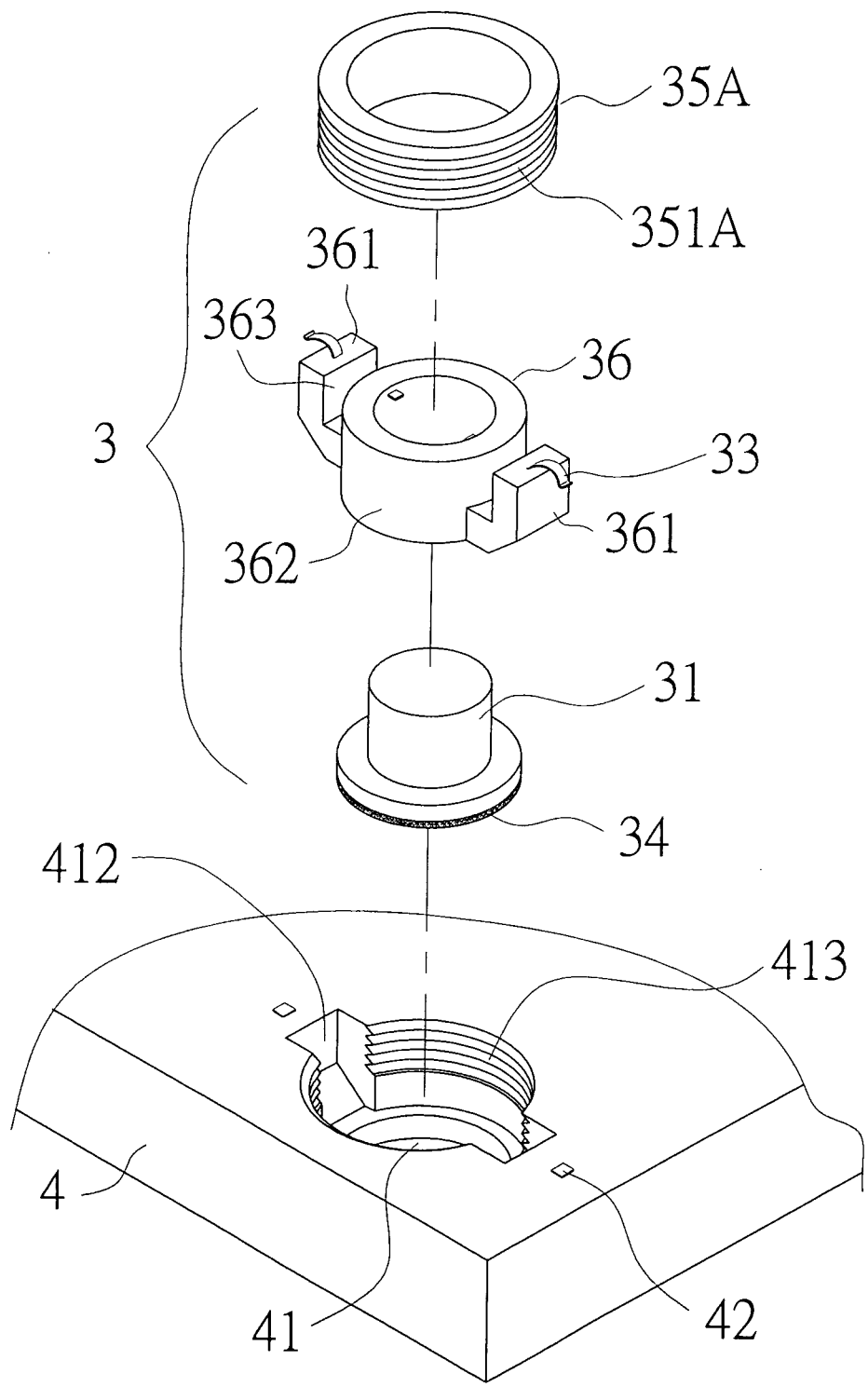
FIG. 3 is a perspective exploded view showing the assembly of the second embodiment of the embedding type LED beads and the substrate or the lamp body of the present invention.
Figure 4:
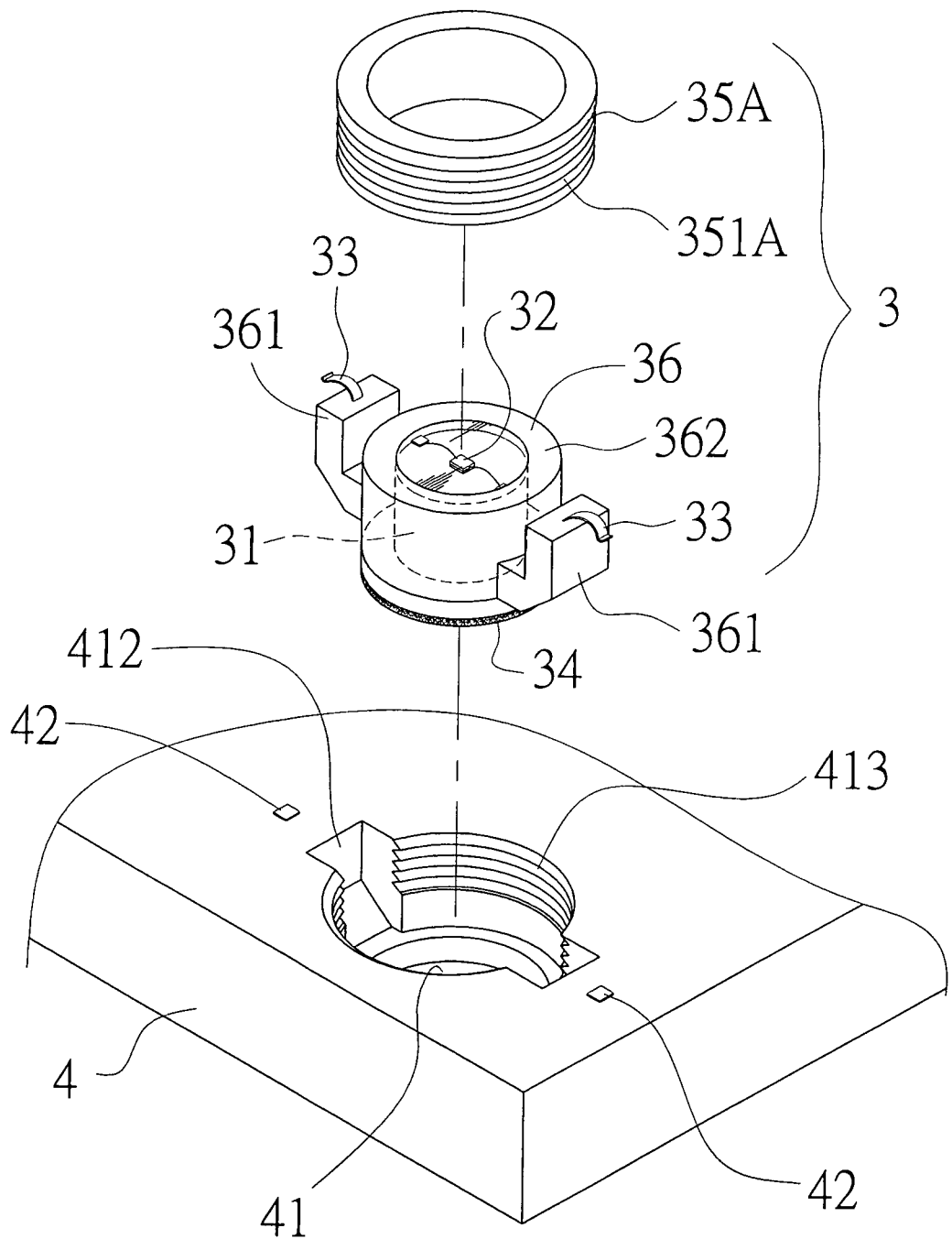
FIG. 4 is another perspective exploded view showing the assembly of the second embodiment of the embedding type LED beads and the substrate or the lamp body of the present invention.
Figure 5:
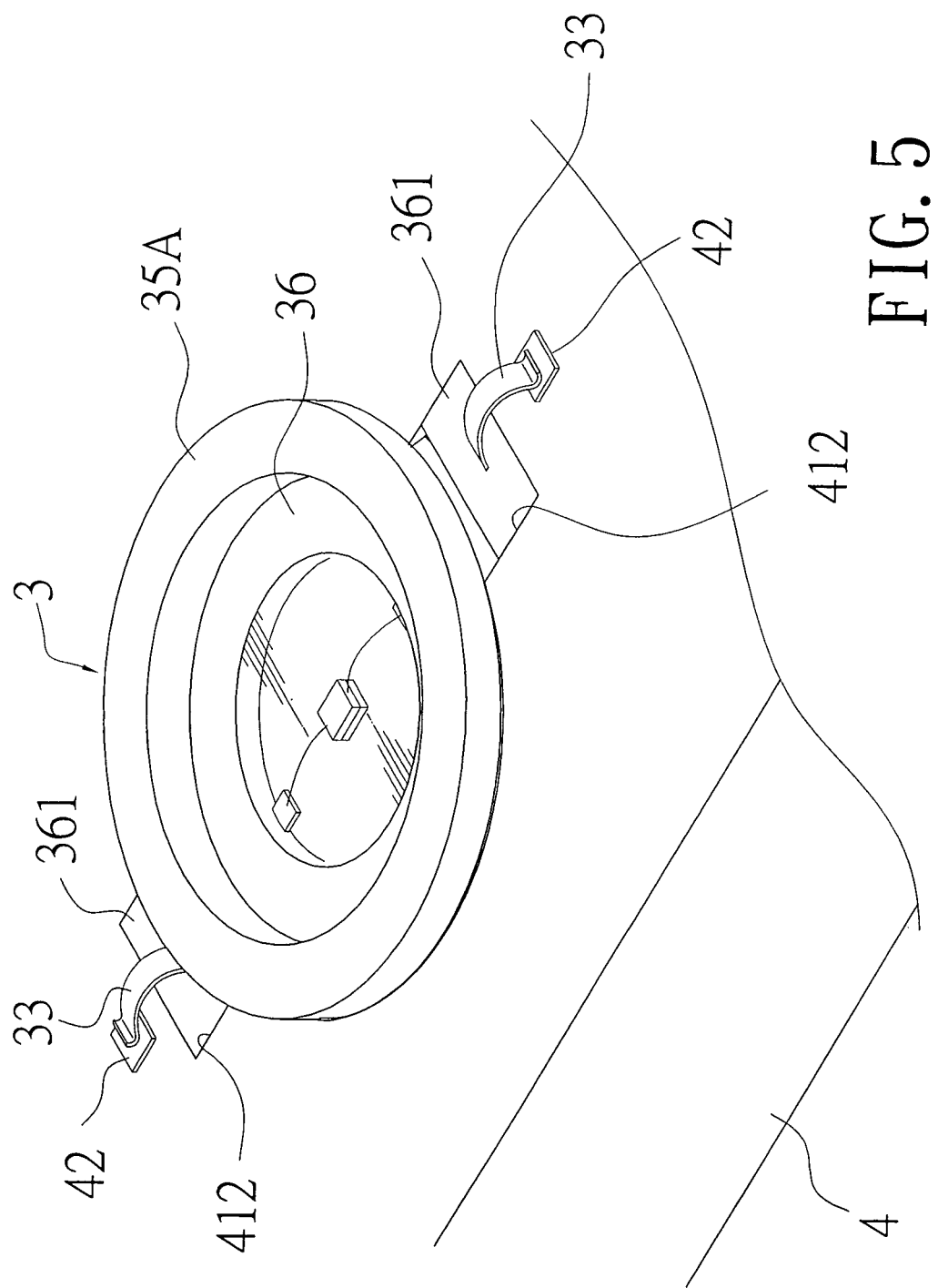
FIG. 5 is a perspective view showing the assembly of the second embodiment of the embedding type LED beads and the substrate or the lamp body of the present invention.
Figure 6:
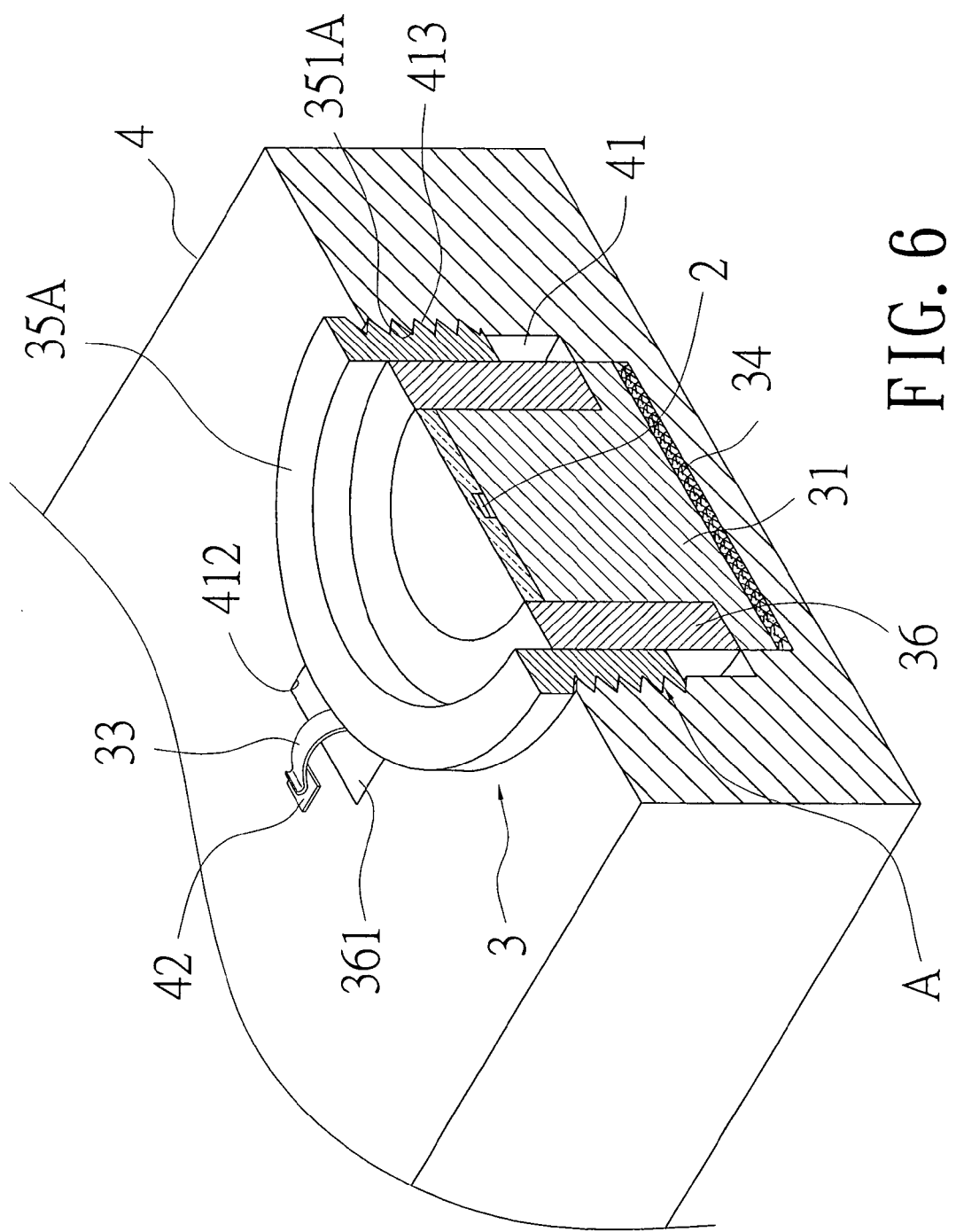
FIG. 6 is a perspective sectional view showing the assembly of the second embodiment of the embedding type LED beads and the substrate or the lamp body of the present invention.
Figure 7:
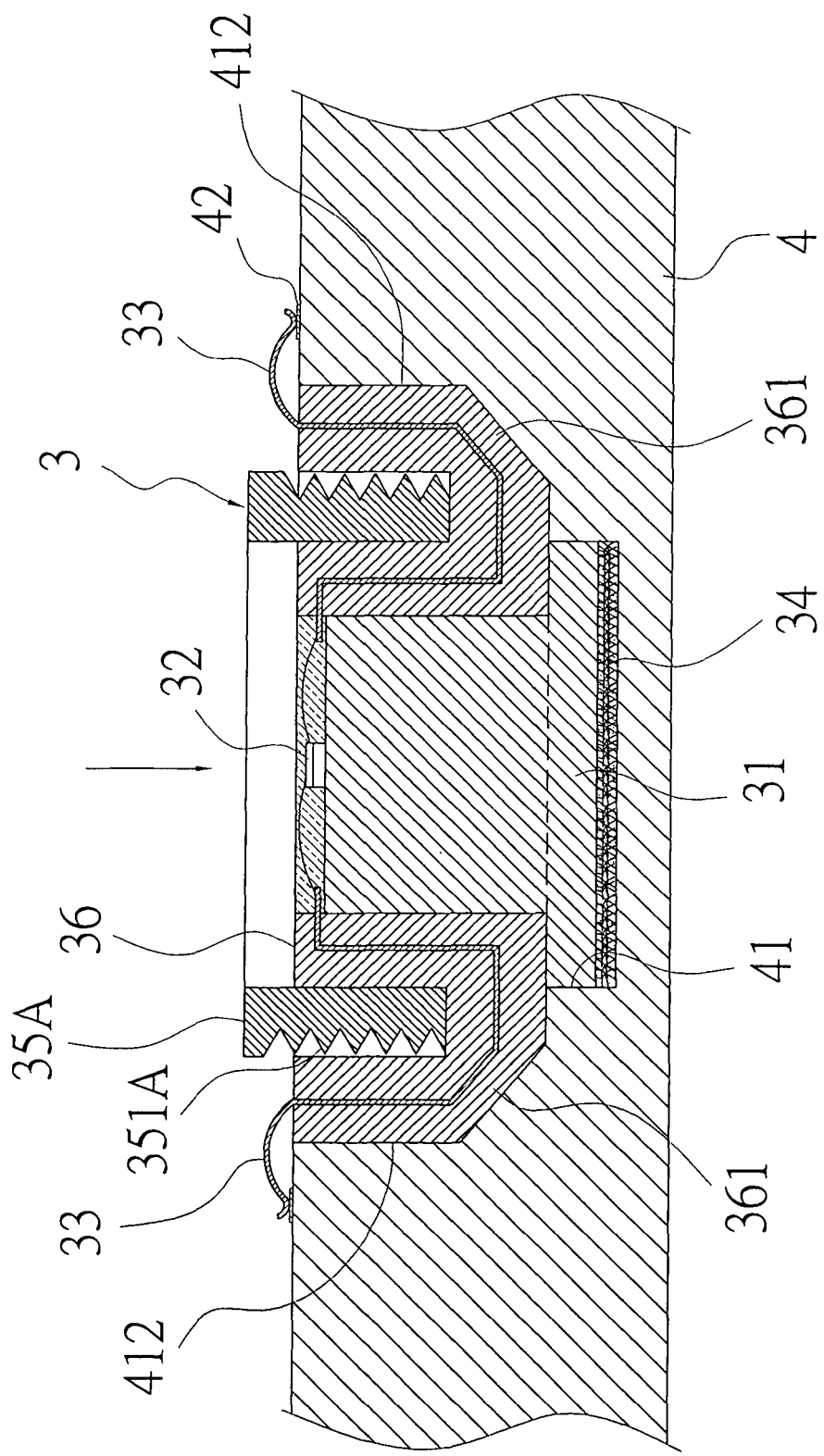
FIG. 7 is a sectional side view showing the assembly of the second embodiment of the embedding type LED beads and the substrate or the lamp body of the present invention.

In the abovementioned docking fixing structure (A), an inclined guide-stripe (311) is provided on the outer periphery of the heat conductive socket (31) of the embedding type LED beads (3) and a pressing-stripe (411) is provided on the wall surface of the docking hole (41) of the substrate or the lamp body (4). When the embedding type LED beads are rotated to insert into the substrate or the lamp body in assembly process, the embedding type LED beads (3) are gradually inserted and fixed in the docking hole (41) of the substrate or the lamp body (4) for positioning in place by the coordinated pressing of the inclined guide-stripe (311) of the embedding type LED beads (3) and the pressing-stripe (411) on the substrate or the lamp body (4), as shown in FIG. 2.

The above embedding type LED beads (3) further provides, on the bottom of the heat conductive socket (31), a heat conductive layer (34) which preferably has deformable or elastic capability. Therefore, the heat generated by the embedding type LED beads (3) is ensured to be transferred to the substrate or the lamp body (4) for heat dissipation by means of the combination and fixing between the embedding type LED beads (3) and the substrate or the lamp body (4).

The above embedding type LED beads (3) further comprises a fastening member (35A, 35B), either in circular or square shape, provided at the outside or the upside of the heat conductive socket (31), as shown in FIGS. 3 to 9.

FIGS. 3 to 7 are schematic views showing the structure of the second embodiment of the embedding type LED beads and the substrate or the lamp body. As shown in the figures, in case that the fastening member (35A) is in circular shape, the docking fixing structure is provided between the outer periphery of the fastening member (35A) and the inner periphery wall of the docking hole (41).

The above embedding type LED beads (3) further comprises an insulation socket (36) provided between the heat conductive socket (31) and the fastening member (35A). The insulation socket (36) has positioning portions (361) extending outward and then upward. Elastic conductive pieces (33) are embedded in the positioning portions (361), and then connected with the pins of the LED chip (32). A gap (363) is formed between the positioning portions (361) of the insulation socket (36) and the frame body (362) itself for the accommodation of the fastening member (35A). Moreover, positioning notches (412) corresponding to the orientation of the conductive contacts (42) are provided in the docking hole (41) of the substrate or lamp body (4) for the purpose of accommodating the positioning portions (361) of the insulation socket (36). In this manner, the orientation of assembling the insulation socket (36) in the docking hole (41) of the substrate or lamp body (4) is thus locked so as not to be turned.

In assembling process, the heat conductive socket (31) is inserted into the insulation socket (36), then the heat conductive socket (31) and the insulation socket (36) combined together are placed into the docking hole (41) of the substrate or the lamp body (4) in such a manner that the positioning portions (361) of the insulation socket (36) are inserted in the positioning notches (412) of the substrate or the lamp body (4). At this instant, the elastic conductive pieces (33) are in contact with the conductive contacts (42) provided on the substrate or the lamp body (4), in turn the fastening member (35A) are in thread engagement with the docking hole (41) so as to achieve the purpose of fixing the embedded type LED beads (3) on the substrate or the lamp body (4).

In the dock-fixing structure, in more detailed description, a thread segment (351A) is provided on the outer periphery of the fastening member (35A), while a thread segment (413) is provided on the inner periphery wall of the docking hole (41) for the purpose to be in thread-locking with the thread segment (351A) provided on the outer periphery of the fastening member (35A).

Figure 8:
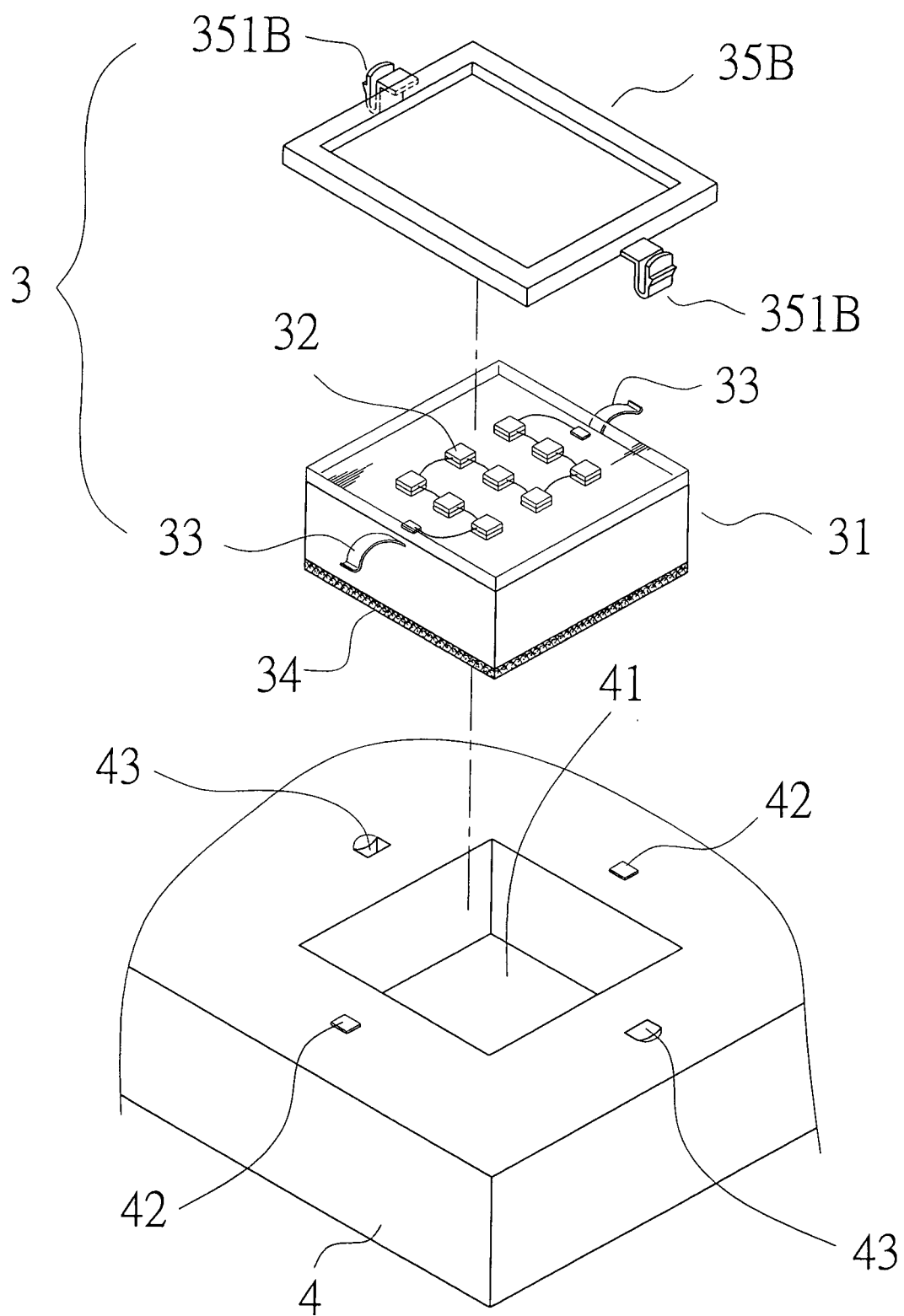
FIG. 8 is a perspective exploded view showing the assembly of the third embodiment of the embedding type LED beads and the substrate or the lamp body of the present invention.
Figure 9:
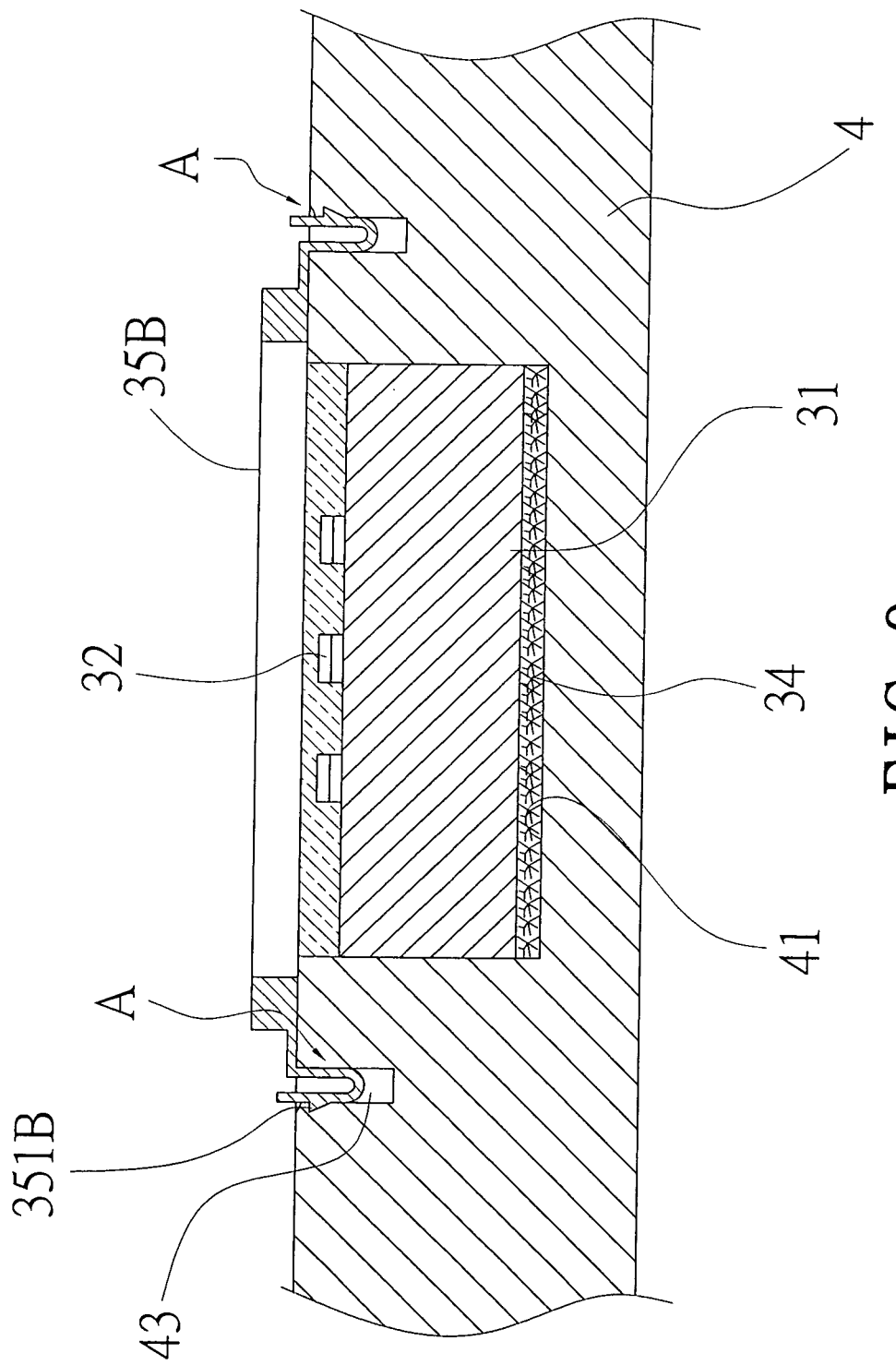
FIG. 9 is a sectional side view showing the assembly of the third embodiment of the embedding type LED beads and the substrate or the lamp body of the present invention.
Figure 10:
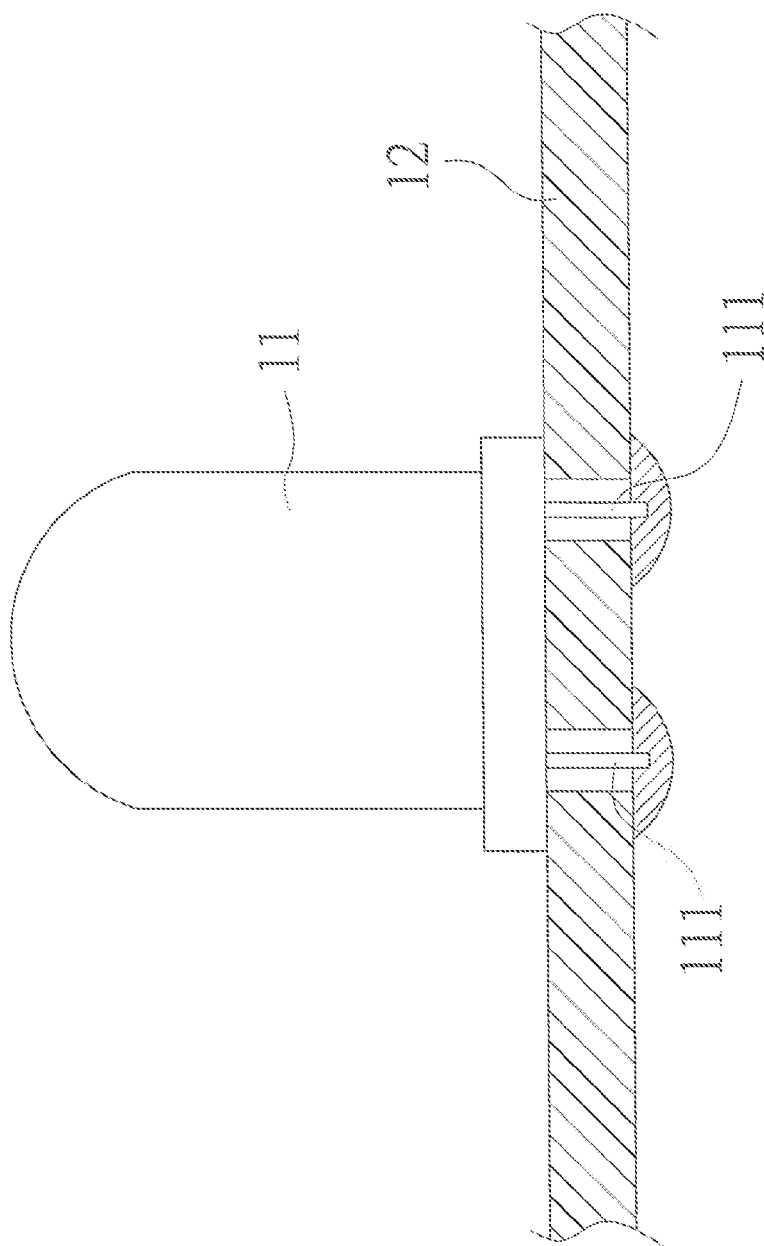
FIG. 10 is a schematic view showing the first combination structure between the LED and the circuit board.
Figure 11:
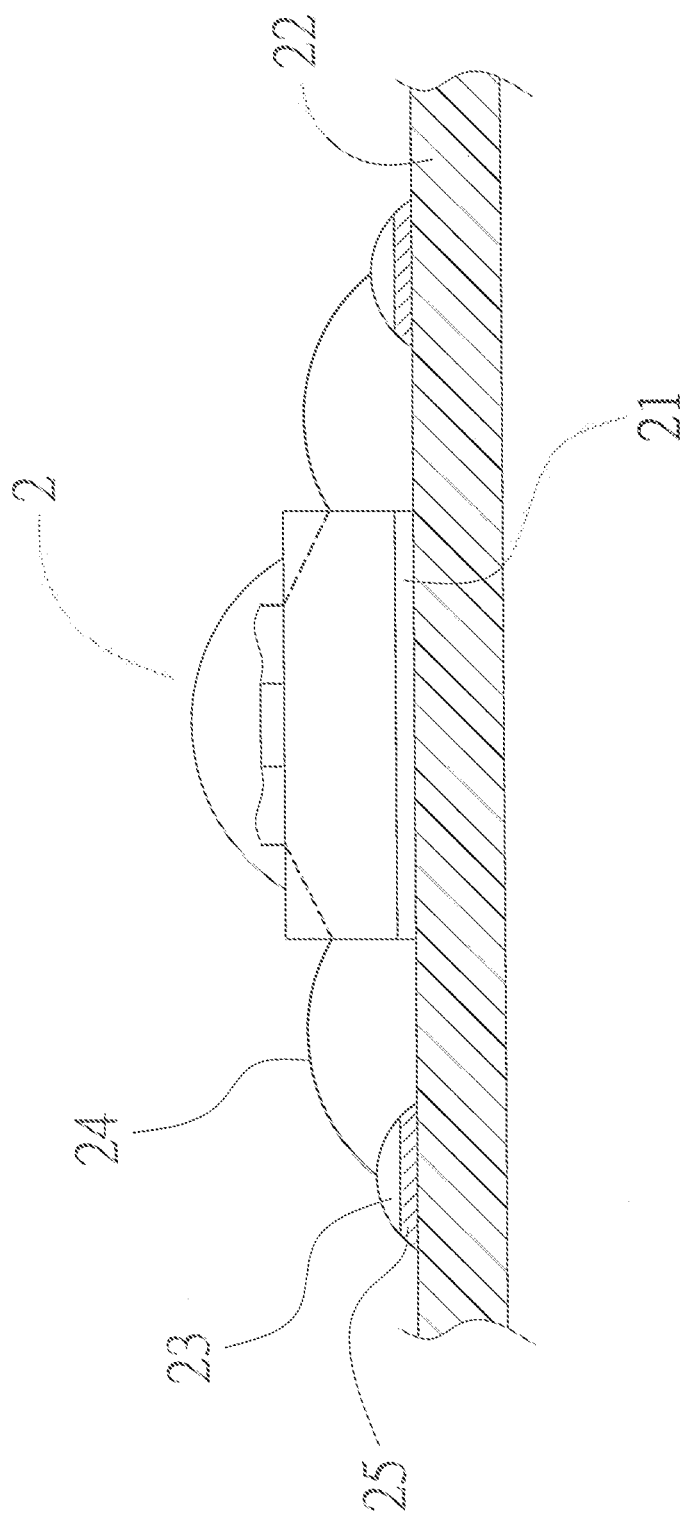
FIG. 11 is a schematic view showing the second combination structure between the LED and the circuit board.

When the fastening member (35B) is in square shape as shown in FIGS. 8 and 9, the fastening member (35B) is provided on the upside of the heat conductive socket (31), and the docking fixing structure (A) is provided between the fastening member (35B) and the substrate or the lamp body (4).

In the abovementioned detachable docking fixing structure (A), the fastening member (35B) is provided with an engaging portion (351B) which is caught and fixed in a corresponding arresting hole (43) provided on the substrate or the lamp body (4) at the time the heat conductive socket (31) being inserted in the docking hole (41) of the substrate or the lamp body (4), so as to fix the heat conductive socket (31) on the substrate or the lamp body (4).

What is claimed is:

1. An embedding type solder point-free combination structure of LED bead with substrate or lamp body, comprising:
    at least one embedding type LED bead, a substrate or lamp body having a structure for docking the embedding type LED bead, a fixing structure for fixing the embedding type LED bead upon insertion into a docking hole in the substrate or the lamp body;
    said embedding type LED bead having a heat conductive socket and at least one LED chip being packaged on a top face of said heat conductive socket, said fixing structure including a member in threaded engagement with said substrate or said lamp body to capture said embedding type LED bead in the docking hole of said substrate or said lamp body in releasable manner,
    wherein said LED chip of said embedding type LED bead and conductive contact points on said substrate or lamp body are maintained in electrical contact to form a solder-point free contact structure, and the heat conductive socket of said embedding type LED bead is locked in heat conductive contact with the docking hole of said substrate or said lamp body;
    wherein said embedding type LED bead further comprises a fastening member having a circular shape and is provided annularly about said heat conductive socket, and said fixing structure is defined between said fastening member and the docking hole of said substrate or said lamp body; and
    wherein said embedding type LED bead further comprises an insulation socket provided between the heat conductive socket and the fastening member, said insulation socket having a frame body and positioning portions extending outward and upward therefrom, a plurality of elastic conductive pieces being embedded in the positioning portions for electrical coupling to the LED chip, a gap being formed between the positioning portions of the insulation socket and the frame body for accommodation of said fastening member;
    positioning notches corresponding to said elastic conductive contacts being formed to communicate with the docking hole of said substrate or lamp body for accommodating said positioning portions of the insulation socket.

2. An embedding type solder point-free combination structure of LED beads with substrate or lamp body as claimed in claim 1, wherein a heat conductive layer preferably having elastic and deformable capability is provided on the bottom of said heat conductive socket.

3. An embedding type solder point-free combination structure of LED beads with substrate or lamp body as claimed in claim 2, wherein the structure of said heat conductive layer is one selected from fiber, sponge or sheet type.

4. An embedding type solder point-free combination structure of LED beads with substrate or lamp body as claimed in claim 1, wherein said detachable dock-fixing structure has an inclined guide-stripe provided on the outer periphery of the heat conductive socket of said embedding type LED beads and a pressing-stripe is provided on the wall face of the docking hole of said substrate or the lamp body, said embedding type LED beads being fixed in said substrate or said lamp body by the coordinated pressing action of the inclined guide-stripe provided on the outer periphery of said embedding type LED beads and the pressing-stripe of said substrate or said lamp body.

5. The embedding type solder point-free combination structure of LED bead with substrate or lamp body as claimed in claim 1, wherein the fixing structure has a thread segment provided on the outer periphery of said fastening member, an opposing thread segment being formed on an inner periphery wall about the docking hole for engaging said thread segment of said fastening member.

* * * * *